United States Patent [19]
Cavigelli

[11] Patent Number: 5,068,636
[45] Date of Patent: Nov. 26, 1991

[54] CURRENT SHUNTING

[75] Inventor: George A. Cavigelli, Lexington, Mass.

[73] Assignee: Doble Engineering Company, Watertown, Mass.

[21] Appl. No.: 427,447

[22] Filed: Oct. 26, 1989

[51] Int. Cl.⁵ .................................................. H01C 7/00
[52] U.S. Cl. ........................................ 338/49; 338/120
[58] Field of Search .............. 338/49, 120; 324/117 R, 324/126; 335/236, 237, 241, 245, 246, 250, 322, 324, 6, 12, 217

[56] References Cited
U.S. PATENT DOCUMENTS

| | | |
|---|---|---|
| 765,889 | 7/1904 | Harris . |
| 958,508 | 5/1910 | Lanphier . |
| 3,843,945 | 10/1974 | Koning .................... 335/217 |
| 4,240,059 | 12/1980 | Wolf et al. . |
| 4,743,846 | 5/1988 | Leclerc et al. . |
| 4,794,326 | 12/1988 | Friedl ...................... 324/117 R |

FOREIGN PATENT DOCUMENTS 1246866 8/1967 Fed. Rep. of Germany .
732587 3/1932 France .

Primary Examiner—Marvin M. Lateef
Attorney, Agent, or Firm—Fish & Richardson

[57] ABSTRACT

A current shunt device has main and auxiliary windings which are located in substantially the same position and are connected in series.

16 Claims, 1 Drawing Sheet

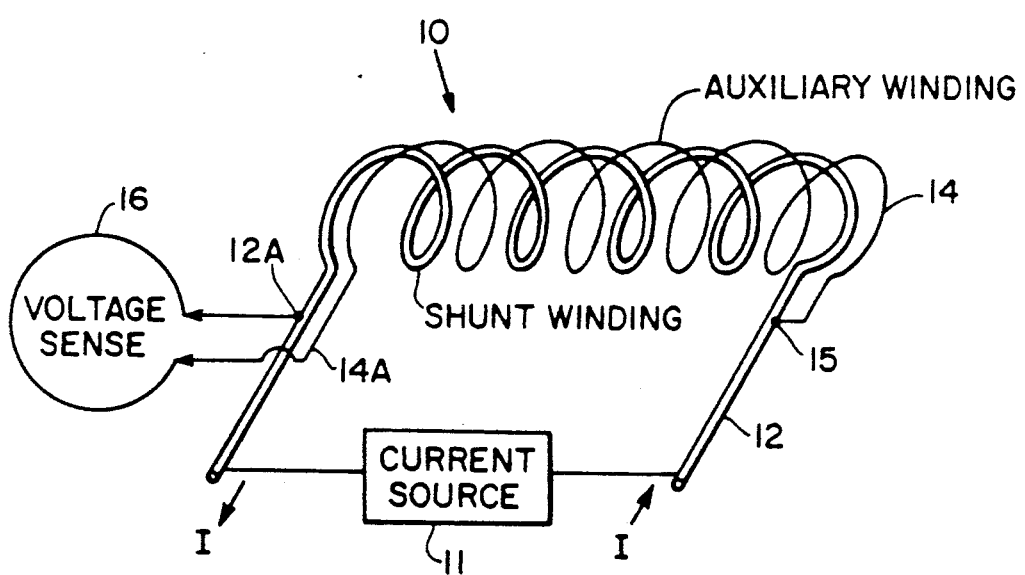

CURRENT SHUNTING

The present invention relates in general to shunting and more particularly concerns novel apparatus and techniques for measuring current while reducing the effects of stray magnetic fields.

A search uncovered U.S. Pat. Nos. 765,889, 958,508, 1,100,708, 3,245,021, 3,359,488, 4,240,059, 4,494,068, 4,629,979 and 4,743,846, French Patent No. 732,587 and German Auslegeschrift 1,246,866.

According to the invention an auxiliary winding in substantially the same position as, such as bifilar with, a main winding is connected in series with the main winding to develop a potential between the ends of the main and auxiliary windings representative of the current through the main winding relatively free of the influence of stray magnetic fields. Other features and advantages will become apparent from the following description when read in connection with the accompanying drawing, the single figure of which is a combined block-schematic diagram illustrating a current shunt according to the invention.

With reference now to the drawing, there is shown a combined block-schematic diagram illustrating a system including the current shunt device 10 according to the invention. Current shunt device 10 includes main shunt winding 12 bifilar and in series with auxiliary winding 14.

With auxiliary winding 14 connected in series with main winding 12, stray magnetic fields induce voltages in main winding 12 and auxiliary winding 14 of equal magnitude and phase relative to their junction 15 so that the potential developed between the other ends 12A and 14A of main and auxiliary windings 12 and 14, respectively, is substantially independent of stray magnetic fields. This arrangement also advantageously reduces the effective inductance of the shunt. Voltage sensing device 16 provides a signal representative of this voltage and the current through main winding 12.

In an embodiment where both windings, i.e., main winding 12 and auxiliary winding 14, are made of very fine wires, these wires may be regarded as in substantially the same position, especially when bifilarly wound, with the effective inductance approaching zero between ends 12A and 14A.

This arrangement corresponds substantially to an ideal 1:1 transformer with no leakage inductance representable by a mutual inductance across the ends of the main and auxiliary windings. The primary current through main winding 12 induces a voltage across the mutual inductance that also appears across auxiliary winding 14. The shunt output voltage is taken by connecting main winding 12 series - bucking with the auxiliary winding 14 of the transformer. Thus, the induced output voltage between ends 12A and 14A consists of two equal and opposite voltages connected in series to provide zero induced voltage.

In embodiments where the main winding wire is large, the coupling between main winding 12 and auxiliary winding 14 is less so that the effective inductance between ends 12A and 14A is reduced, but larger than zero.

By arranging auxiliary winding 14 to have an effective cross section and number of turns equal to that of main winding 12, device 10 exhibits reduced susceptibility to stray-magnetic-field-induced voltage when this field is substantially uniform in the region embracing device 10.

Other embodiments are within the following claims.

What is claimed is:

1. A current shunt device comprising,
   a main winding having first and second ends for carrying current to be sensed,
   an auxiliary winding having first and second ends and being coextensive with said main winding,
   said second ends being connected together,
   whereby the potential between said first ends is representative of said current to be sensed substantially independent of voltages induced in said windings by stray magnetic fields.

2. A current shunt device in accordance with claim 1 wherein said main winding is bifilar with said auxiliary winding.

3. A current shunt device in accordance with claim 1 and further comprising a current source connected in series with said main winding,
   and a voltage sensing device connected between said first ends.

4. A current shunt device in accordance with claim 3 wherein said main winding is bifilar with said auxiliary winding.

5. A current shunt device in accordance with claim 1 wherein the effective cross section and number of turns of said auxiliary winding is substantially equal to the effective cross section and number of turns respectively of said main winding to reduce susceptibility to stray-magnetic-field-induced voltage when the stray magnetic field is substantially uniform in the region embracing said current shunt device.

6. A current shunt device in accordance with claim 2 wherein the effective cross section and number of turns of said auxiliary winding is substantially equal to the effective cross section and number of turns respectively of said main winding to reduce susceptibility to stray-magnetic-field-induced voltage when the stray magnetic field is substantially uniform in the region embracing said current shunt device.

7. A current shunt device in accordance with claim 5 and further comprising a current source connected in series with said main winding,
   and a voltage sensing device connected between said first ends.

8. A current shunt device in accordance with claim 6 and further comprising a current source connected in series with said main winding,
   and a voltage sensing device connected between said first ends.

9. A current shunt device in accordance with claim 1 wherein said main wining and said auxiliary winding are made of wires sufficiently fine so that the effective inductance between said first ends approaches zero,
   whereby said main and auxiliary windings correspond substantially to an ideal 1:1 transformer with no leakage inductance representable by a mutual inductance across the ends of said main and auxiliary windings.

10. A current shunt device in accordance with claim 2 wherein said main winding and said auxiliary winding are mode of wires sufficiently fine so that the effective inductance between said first ends approaches zero,
    whereby said main and auxiliary windings correspond substantially to an ideal 1:1 transformer with no leakage inductance representable by a mutual inductance across the ends of said main and auxiliary windings.

11. A current shunt device in accordance with claim 9 and further comprising a current source connected in series with said main winding, and a voltage sensing device connected between said first ends.

12. A current shunt device in accordance with claim 10 and further comprising a current source connected in series with said main winding, and a voltage sensing device connected between said first ends.

13. A current shunt device in accordance with claim 5 wherein said main winding and said auxiliary winding are made of wires sufficiently fine so that the effective inductance between said first ends approaches zero, whereby said main and auxiliary windings correspond substantially to an ideal 1:1 transformer with no leakage inductance representable by a mutual inductance across the ends of said main and auxiliary windings.

14. A current shunt device in accordance with claim 6 wherein said main winding and said auxiliary winding are made of wires sufficiently fine so that the effective inductance between said first ends approaches zero, whereby said main and auxiliary windings correspond substantially to an ideal 1:1 transformer with no leakage inductance representable by a mutual inductance across the ends of said main and auxiliary windings.

15. A current shunt device in accordance with claim 13 and further comprising a current source connected in series with said main winding, and a voltage sensing device connected between said first ends.

16. A current shunt device in accordance with claim 14 and further comprising a current source connected in series with said main winding, and a voltage sensing device connected between said first ends.

* * * * *